United States Patent
Corisis

(10) Patent No.: US 7,226,813 B2
(45) Date of Patent: Jun. 5, 2007

(54) SEMICONDUCTOR PACKAGE

(75) Inventor: David J. Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/358,275

(22) Filed: Feb. 5, 2003

(65) Prior Publication Data

US 2003/0119224 A1    Jun. 26, 2003

Related U.S. Application Data

(60) Division of application No. 09/996,595, filed on Nov. 30, 2001, now Pat. No. 6,576,988, which is a continuation-in-part of application No. 09/385,203, filed on Aug. 30, 1999, now Pat. No. 6,339,253.

(51) Int. Cl.
*H01L 21/00* (2006.01)
(52) U.S. Cl. ...................... 438/118; 438/123
(58) Field of Classification Search ............... 438/111, 438/112, 113, 118, 121, 123, 124
See application file for complete search history.

(56) References Cited

U.S. PATENT DOCUMENTS

| | | | |
|---|---|---|---|
| H73 H * | 6/1986 | Claasen et al. ............ 257/669 |
| 4,788,583 A | 11/1988 | Kawahara et al. |
| 4,849,857 A * | 7/1989 | Butt et al. ................. 361/708 |
| 4,997,517 A | 3/1991 | Parthasarathi |
| 5,198,883 A * | 3/1993 | Takahashi et al. .......... 257/676 |
| 5,285,105 A * | 2/1994 | Cain ......................... 257/672 |
| 5,318,820 A * | 6/1994 | Smith et al. .................. 428/77 |
| 5,376,909 A | 12/1994 | Nelson et al. |
| 5,442,231 A * | 8/1995 | Miyamoto et al. .......... 257/668 |
| 5,496,435 A * | 3/1996 | Abbott ....................... 156/556 |
| 5,583,377 A | 12/1996 | Higgins, III |
| 5,796,162 A * | 8/1998 | Huang ........................ 257/676 |
| 5,907,184 A | 5/1999 | Corisis et al. |
| 5,929,517 A * | 7/1999 | Distefano et al. ........... 257/707 |
| 6,130,474 A | 10/2000 | Corisis |
| 6,222,258 B1 | 4/2001 | Asano et al. |

FOREIGN PATENT DOCUMENTS

JP    06188354 A  *  7/1994

* cited by examiner

*Primary Examiner*—N. Drew Richards
(74) *Attorney, Agent, or Firm*—Dickstein Shapiro LLP

(57) ABSTRACT

A semiconductor package is provided which includes a semiconductor die which is formed in a die mounting area of a substrate. The die mounting area includes a frame with an opening formed therein, a die paddle, and a descending portion which connects the die paddle to the frame. The die mounting area forms a cavity to receive the semiconductor die such that an active surface of the semiconductor die is planar with the top surface of the substrate.

10 Claims, 9 Drawing Sheets

SEMICONDUCTOR PACKAGE

CROSS-REFERENCE TO RELATED APPLICATIONS

The present application is a divisional of application Ser. No. 09/996,595, filed Nov. 30, 2001 (Issued as U.S. Pat. No. 6,576,988 on Jun 10, 2003), which is a continuation-in-part of application Ser. No. 09/385,203 filed Aug. 30, 1999 (Issued as U.S. Pat. No. 6,339,253 on Jan. 15, 2002), the disclosure of which is herewith incorporated in its entirety.

BACKGROUND

The present invention relates generally to semiconductor packaging and manufacturing, and more particularly to a package for a semiconductor die.

Recently, electronic systems have incorporated high-level semiconductor devices, such as integrated circuits, to perform complex processing functions. The integrated circuits include diodes, resistors, capacitors, transistors, and microprocessors. These devices are commonly connected together on the integrated circuit or semiconductor die. The semiconductor die is packaged in a structure which includes terminal connections which may be connected to a printed circuit board or other substrate. The resulting semiconductor die may be connected to multiple integrated circuits to perform multiple functions in the electronic system.

The demand in integrated circuit design has increased toward smaller circuits via miniaturization which can perform more functions. One technique is to increase the functions and decrease the size of the circuit. Another technique is to increase the circuit density of the semiconductor die. To achieve these demands, more input/output connections are formed from the semiconductor die to a surface of the substrate.

Generally, the semiconductor die is initially mounted to a die receiving area. The die protrudes from a surface of the substrate, and is electrically connected to the substrate by the bond wires. Known methods for forming the electrical connections include wirebonding and tape-automated bonding (TAB). In TAB, metal tape leads are attached between bond pads on the semiconductor die and bond pads on the substrate. An encapsulant may be used to cover the bond wires and metal tape leads to prevent contamination. In wirebonding, a plurality of bond wires are attached one at a time from each bond pad on the semiconductor die to a corresponding bond pad on the substrate. After the electrical connections ate formed and the die is encapsulated, a trim and form operation is used to separate the die from the package into individual integrated circuits.

Several types of packaging are known. Typical packages include ball grid array (BGA), flip chip, microBGA, fine pitch BGA, and chip scale packages.

Currently, each of these packages requires special tooling and supplies to form the package. One drawback to the current package designs is that they do not provide adequate structural support for the non-active surface (i.e. the surface of the die which is not connected to the die receiving area) of the semiconductor die during the packaging process. This causes chip failure because the chip tends to crack or fracture. This means that the portion of the tape between adjacent dice tends to crack during the trim and form process. This is because the tape is not adequately supported between adjacent dice on the substrate. Another drawback is that the current substrates do not provide a suitable recessed surface for the TAB applications.

Therefore, a need exists for a semiconductor package that protects the die from cracking or fracturing during a semiconductor packaging process.

SUMMARY

In general, the invention is directed to a semiconductor package which includes a substrate having a die-mounting area. The die-mounting area forms a cavity to receive a semiconductor die such that an active surface of the die is planar with the top surface of the substrate.

Accordingly, the invention provides a method for fabricating semiconductor packages. The method includes forming a leadframe with a plurality of downset portions, attaching semiconductor dies to the downset portions, each semiconductor die including contact pads, attaching a tape to the leadframe and the dies, the tape including electrical traces, and electrically connecting the contact pads of the dies with the electrical traces of the tape.

The invention also provides a method for fabricating a semiconductor package that includes the steps of forming a substrate having a downset portion, attaching a semiconductor die to the downset portion, the semiconductor die including contact pads, attaching a tape to the substrate and the die, the tape including electrical traces, and electrically connecting the contact pad of the die with the electrical traces of the tape.

In one aspect, the semiconductor package a substrate having a first surface, a downset portion extending from the substrate to form a cavity, a semiconductor die having contact areas and being attached to the downset portion within the cavity, and a tape including circuit traces attached to the first surface, the circuit traces of the tape being electrically connected to the contact areas of the semiconductor die.

Implementations of the invention include one or more of the following. The substrate may be formed from ceramic, plastic, or metal alloy. The substrate may include a plurality of first bond pads formed on the first surface, and a plurality of conductive terminals formed on the first surface. A plurality of circuit traces may be formed on the first surface to form an electrical path between selected ones of the first bond pads and the conductive terminals. The semiconductor die may include a plurality of second bond pads formed on the active surface of the die, and the semiconductor package may include a plurality of electrical connections formed between selected ones of the first and second bond pads. The electrical connections may be formed by wirebonding. The plurality of conductive terminals may be in electrical communication with a plurality of corresponding terminals on a printed circuit board. The circuit traces may be formed from aluminum, gold, or copper. An encapsulating layer may be formed on the package to encapsulate the electrical connections. The conductive terminals may be formed from gold or copper, and the first bond pads may be formed from gold or copper. A layer of tape having circuitry may be employed to apply circuitry to the active surface of the semiconductor die. The substrate may include a plurality of second indexing holes, and the tape of material may include a plurality of first indexing holes such that the first indexing holes and the second indexing holes are aligned when the circuitry is formed on the active surface of the semiconductor die. The die paddle may include a surface operable to dissipate heat. The tape of circuitry may be formed from metal. The tape of circuitry may be co-planar with the first surface.

In another aspect, the invention is directed to an electronic circuit having a substrate which includes a first surface and a second surface. The frame is formed on the first surface to define an opening in the substrate. A plurality of bars extend from the second surface of the substrate, and a die paddle extends between the plurality of bars to form a cavity to receive at least one semiconductor die. An active surface of the semiconductor die is planar with the first surface of the substrate. A printed circuit board is positioned relative to the substrate, and a plurality of electrical connections are formed between the active surface of the semiconductor die and the printed circuit board. The package may include first and second rails formed integral with or mounted on the first surface of the substrate.

In another aspect, the invention is directed to a semiconductor package which includes a substrate having a first surface and a second surface. A plurality of die-mounting areas are formed in the substrate for receiving a plurality of semiconductor dice. Each of the die-mounting areas include a frame formed on the first surface of the substrate to define an opening in the substrate, and a plurality of bars extending from the second surface of the substrate. A die paddle is formed between the plurality of bars to form a cavity to receive one of the semiconductor dice such that an active surface of the semiconductor die is planar with the first surface of the substrate.

These and other advantages and features of the invention will be more readily understood from the following detailed description of the invention that is provided in connection with the accompanying drawings.

DETAILED DESCRIPTION OF PREFERRED EMBODIMENTS

Figure 1:
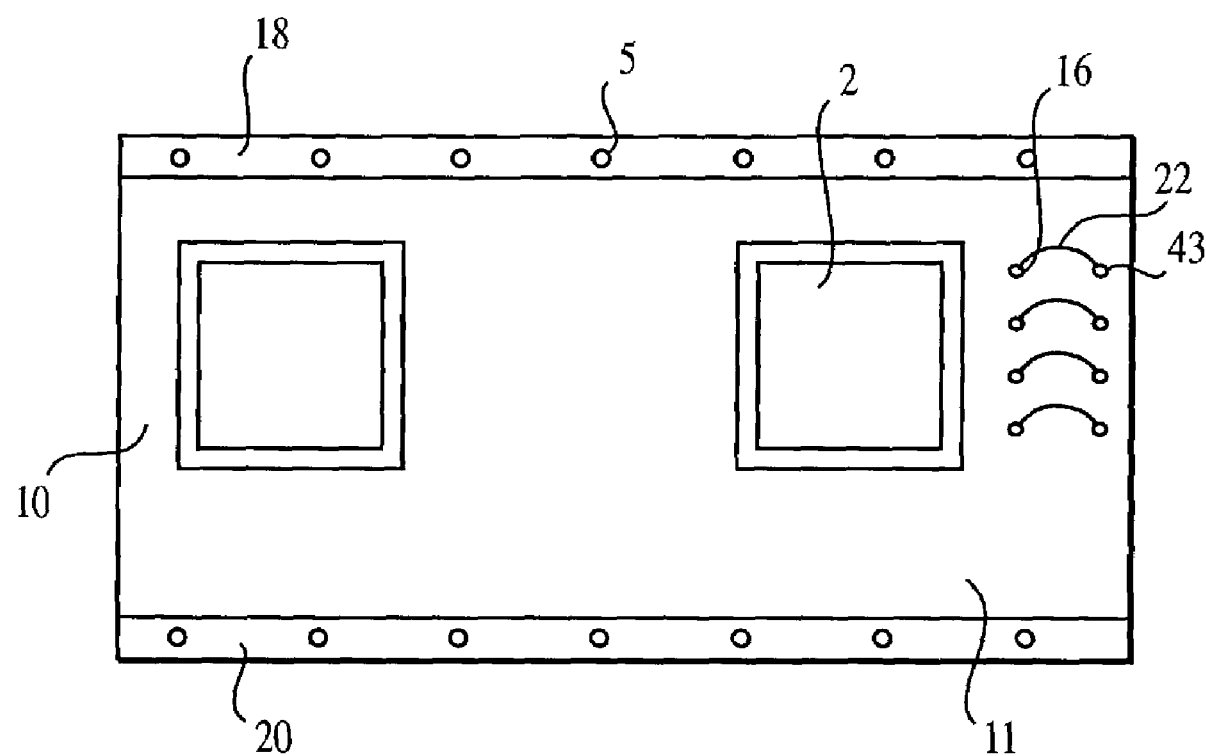
FIG. 1 illustrates a top view of a semiconductor package in accordance with a preferred embodiment.

FIG. 1 illustrates an implementation of a semiconductor package 1 in accordance with a preferred embodiment. Semiconductor package 1 includes a substrate. Substrate 10 is formed from a sheet of material with indexing holes 5 and side rails 18 and 20. Substrate 10 may be formed from ceramic, plastic, metal alloy, or other suitable materials. The indexing holes facilitate the attachment and removal of the substrate from machines during the packaging process. Side rails 18 and 20 may be formed from substrate 10. Side rails 18 and 20 may be trimmed during a trim and form operation. Side rails 18 and 20 provide support for substrate 10 and an increased stiffness for the package 1.

The substrate 10 also includes bond pads 16, conductive terminals 43, and circuit traces 22 formed onto top surface 11 of substrate 10. The circuit traces and bond pads 16 may be formed by a semiconductor metallization process, for example, sputtering.

To form bond pads 16 and circuit traces 22, conductive insulating layer (not shown) is formed between the substrate surface 11 and the circuit traces 22. Suitable insulating layers include polyimide or Kapton tape. Circuit traces and bond pads are then etched or photopatterned into the top surface 11. Suitable materials for bond pads 16 include gold or silver. Circuit traces 22 may be formed from aluminum, copper, gold or other suitable material. Alternatively, bonds pads 16 and circuit traces 22 may be mounted to the top surface 11 by metal deposition. Substrate 10 also may include a finish or plating (not shown) such as palladium.

Conductive terminals 43 may be formed onto top surface 11 of substrate 10 by tape-automated bonding or wirebonding. Conductive terminals 43 provide the electrical contact of substrate 10 to a printing wiring board (not shown) or other suitable substrate. In particular, each conductive terminal 43 electrically connects a bond pad 16 of the semiconductor die to a corresponding terminal on the printed wiring board via circuit traces 22.

FIG. 1 shows a semiconductor die 2 is mounted to top surface 11 of substrate 10. A plurality of semiconductor dice 2 may also be mounted to the surface 11 of substrate 10 during the packaging and manufacturing processes. The semiconductor dice may be singulated into different integrated circuits using a trim and form operation. For simplicity, only one semiconductor die 2 will be discussed.

Semiconductor die 2 may be a semiconductor device, an integrated circuit, or an optical component. Semiconductor die may be formed from silicon. The substrate may also be formed from silicon to have a coefficient of thermal expansion (CTE) which is similar to the CTE of the semiconductor die 2. This reduces the stress developed between the substrate 10 and the semiconductor die 2 when they are exposed to heat during the packaging process.

Figure 2:
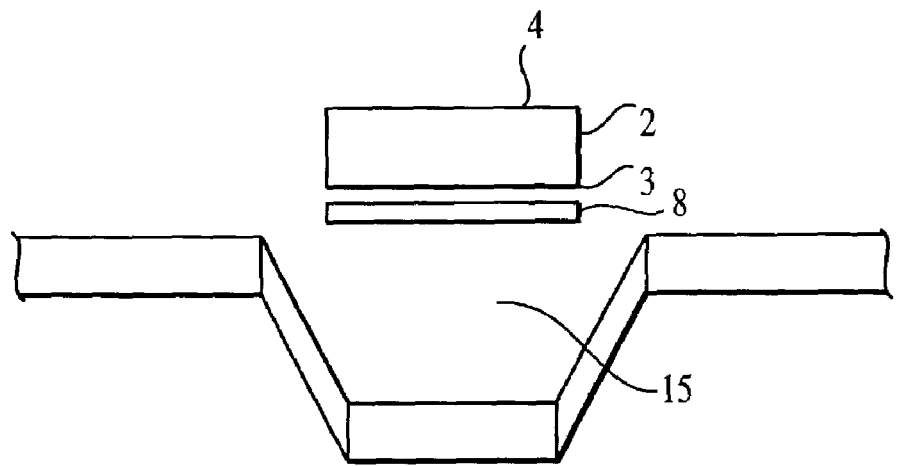
FIG. 2 is a view of a semiconductor die mounted to the package of FIG. 1.

FIG. 2 shows that semiconductor die includes a non-active surface 3. The non-active surface 3 is mounted facedown to the bottom surface of a die mounting area 15 formed in substrate 10. An adhesive layer 8 formed from, for example, epoxy, acrylic, silicon, polyimide, or other suitable dielectric material may be formed between the nonactive surface 3 and the bottom surface of the die mounting area 15 to secure the semiconductor die to the substrate.

Figure 3:
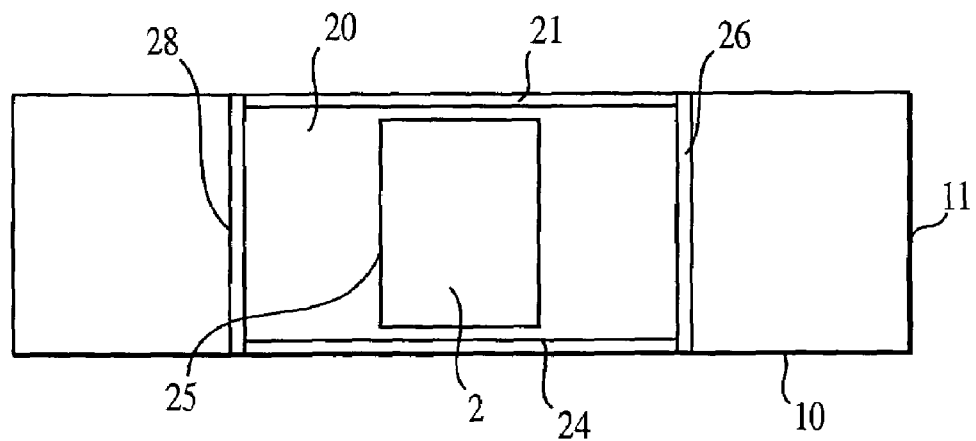
FIG. 3 is a top view of a die mounting area of the package of FIG. 1.

As shown in FIG. 3, the die mounting area 15 includes a frame 20 which forms the perimeter of the die mounting area 15. The frame 20 includes top and bottom rails 21 and 24 and side rails 26 and 28 which form an opening 25. The frame 20 may be formed in the top surface 11 of substrate 10 by etching or stamping. The frame 20 may be rectangular, square, circular, or other suitable shape which corresponds to the dimensions of semiconductor die 2. Preferably, the opening 25 of frame 20 defines an area which is slightly larger than the size of semiconductor die 2.

Figure 4:
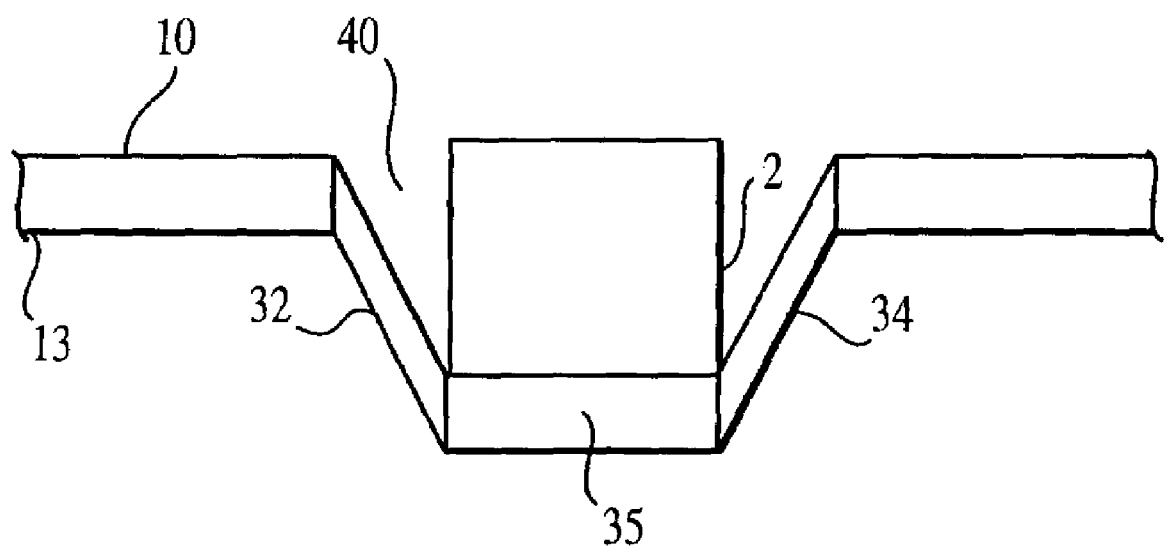
FIG. 4 illustrates a side view of the die mounting area of FIG. 3A.

The die mounting area 15 also includes a die paddle 35 for receiving a semiconductor die 2 during the packaging process. As shown in FIG. 4, the die paddle 35 is formed below the bottom surface 13 of substrate 10. The die paddle 35 may be formed from substrate 10 by conventional down set or depression techniques. Die paddle 35 may be used as a heat sink to dissipate heat from semiconductor die 2 during processing. The die paddle 35 is connected to the bottom surface 13 of substrate 10 by bars 32 and 34. The bars 32 and 34 may be formed at an angle relative to the bottom surface 13. Alternatively, the bars 32 and 34 may also be found perpendicular to the surface 13. The bars 32 and 34 may be connected to the bottom surface 13 and die paddle 35 by spot weld, tape, or glue. The bars 32 and 34 may also be formed from substrate 10 by etching, milling, or stamping. A cavity 40 is thus formed in die mounting area 15 by die paddle 35, bars 32 and 34 and opening 25 of frame 20. Preferably, the semiconductor die 2 is mounted inside the cavity 40 such that surface 4 of semiconductor die 2 is planar with or slightly below top surface 11 of substrate 10. Active surface 3 may also extend a distance above the surface 11 depending on the manufacturing process.

One advantage to the configuration shown in FIG. 4 is that the die paddle 35 protects the bottom surface 3 of the semiconductor die 2 during processing. Additionally, frame 20 adds structural support to the package 1 during the manufacturing process.

Figure 5:
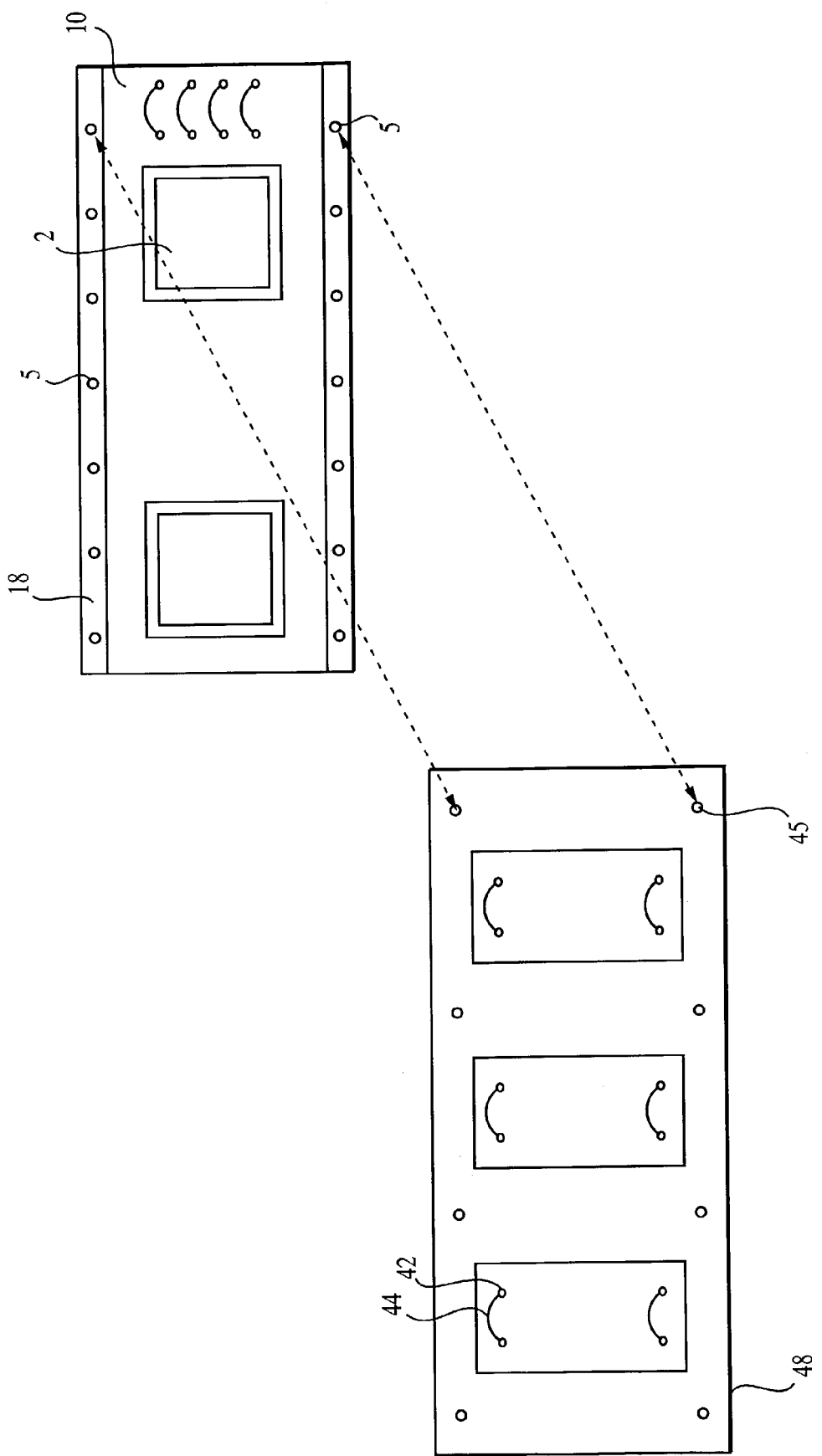
FIG. 5 illustrates the tape of circuitry used to form circuitry on the semiconductor die of FIG. 2.

FIG. 5 shows a plurality of bond pads 42 and circuit traces 44 may be formed onto semiconductor die 2 as follows. A tape 48 with circuitry (i.e. bond pads 42 and circuit traces 44) may be attached onto each of the semiconductor dice 2 by aligning indexing holes 45 of tape 48 with indexing holes 5 (FIG. 1) of substrate 10. Tape 48 may be in strip tape or a tape in a reel-to-reel format. An adhesive layer (not shown) may be formed onto the active surface 4 of the die to secure the tape 48 to the active surface 4 of semiconductor die 2. Next, the tape 48 is exposed to suitable pressure to form a bond between the active surface 4 and the bottom surface of the tape.

Tape 48 is substantially flat when it is applied to the substrate 10. This is because the semiconductor die fits in cavity 40 such that the active surface 4 is substantially planar with the top surface 10. This means that fractures and bumps in the tape 48 that occur due to the protrusion of the semiconductor die 2 from the packages in known systems are minimized. Additionally, the tape 48 may be easily aligned with the semiconductor die 2 using indexing holes 5 and indexing holes 45.

Figure 6:
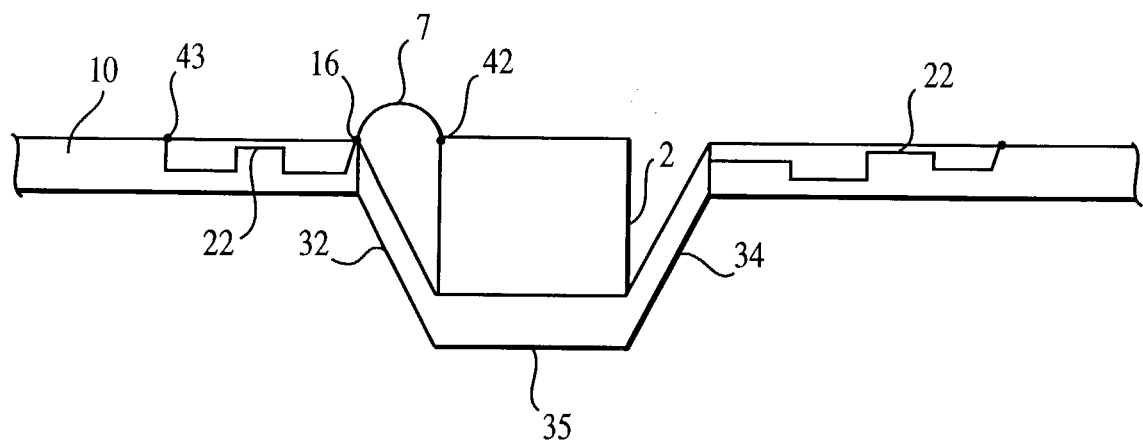
FIG. 6 illustrates an electrical connection formed between the semiconductor die and the substrate.

As shown in FIG. 6, the semiconductor die 2 is then electrically connected to the substrate 10 by electrical connections 7. Electrical connections 7 are thin wires which are formed from an electrically conductive material such as gold or copper. One suitable technique to form the electrical connections 7 is wirebonding. The wirebonding may be performed by a conventional wirebonding apparatus (not shown). Suitable wirebonding techniques include ultrasonic bonding, thermo-compression bonding and thermosonic bonding. An electrical path is thus formed between semiconductor die 2 and conductive terminals 43 through bond pads 42 and 16 and circuit traces 22. The conductive terminals 43 may then be connected to corresponding terminals on a printed circuit board (not shown) by wirebonds, solder balls, or tape-automated bonding.

Alternatively, conductive terminals 43, bond pads 16, and circuit traces 22 may not be formed on surface 11 of substrate 10. In this processing regime, the bond pads 42 of semiconductor die 2 may be electrically connected to corresponding terminals on the printed circuit board via electrical connections 7.

Figure 7:
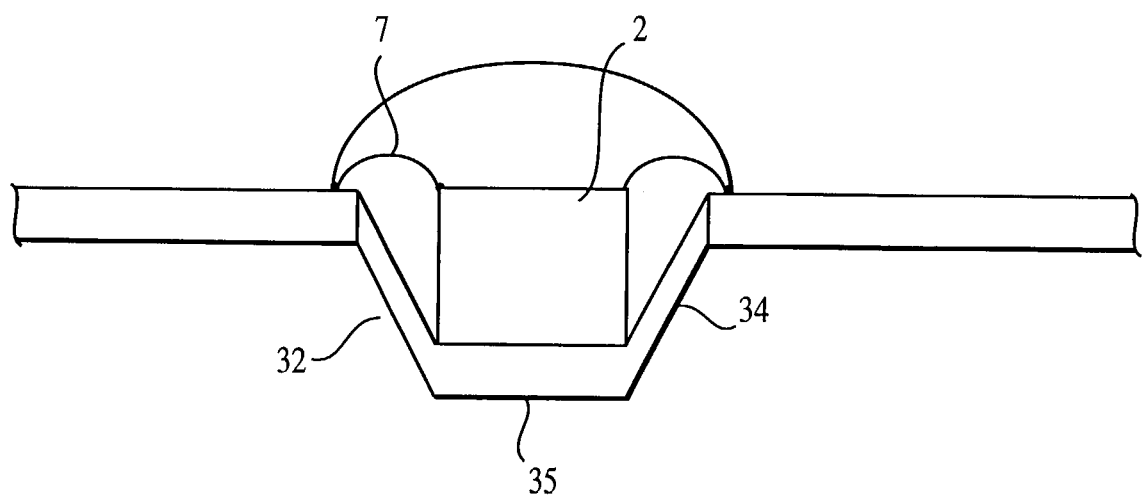
FIG. 7 illustrates an encapsulating layer applied to a portion of the package of FIG. 1.

FIG. 7 shows an encapsulating layer 60 is formed over a portion of the semiconductor die 2. Encapsulating layer 60 may also be deposited over the entire area of the semiconductor die 2 defined by the active surface 3 and bond pads 16. Encapsulating layer 60 is used to protect the semiconductor die 2 from, for example, environmental hazards during processing. Also, encapsulating layer 60 protects and seals electrical connections 7 and bond pads 42 and 16. The encapsulating material may also leave a large portion of the active surface 4 exposed.

The encapsulation layer 60 may be formed from a glob top of material such as epoxy, silicon, or polyimide material. Encapsulation layer 60 is applied to the package 1 by directly forming the layer 60 over the area to be encapsulated such as bond pads 42 and 16. Alternatively, the encapsulating layer may be formed by depositing a material with a high viscosity around the perimeter to be encapsulated, and then filling the center of the layer with a material having a lower viscosity level. After application, the encapsulation material is then cured at a temperature between 150° C. and 200° C.

Each of the semiconductor die 2 formed on substrate may be removed from substrate 10 by a singulating process such as slicing or shearing to form individual circuits.

The package protects the bottom of the die 2. Further, tape 48 can be applied to be coplanar with the top surface 11 because the die 2 is recessed by die paddle 35. This means that the breakage or fracture of the die 2 or tape 48 is minimized during the packaging process. Additionally, the configuration of die paddle 35 allows a BGA having a grid larger than a surface of die 2 to be employed.

Another embodiment of the invention is illustrated in FIGS. 8–12. An assembled composite strip 100 is shown including a plurality of semiconductor packages 130. Some of the semiconductor packages 130 are shown with dies 138, while others are shown without the dies 138 for ease of illustration. The composite strip 100 includes a lead frame support structure 110 having opposing side rails 118 and 120. The lead frame structure 110 may be formed from ceramic, plastic, metal alloy, or other materials which are suitable for providing rigidity to the composite strip 100.

Figure 8:
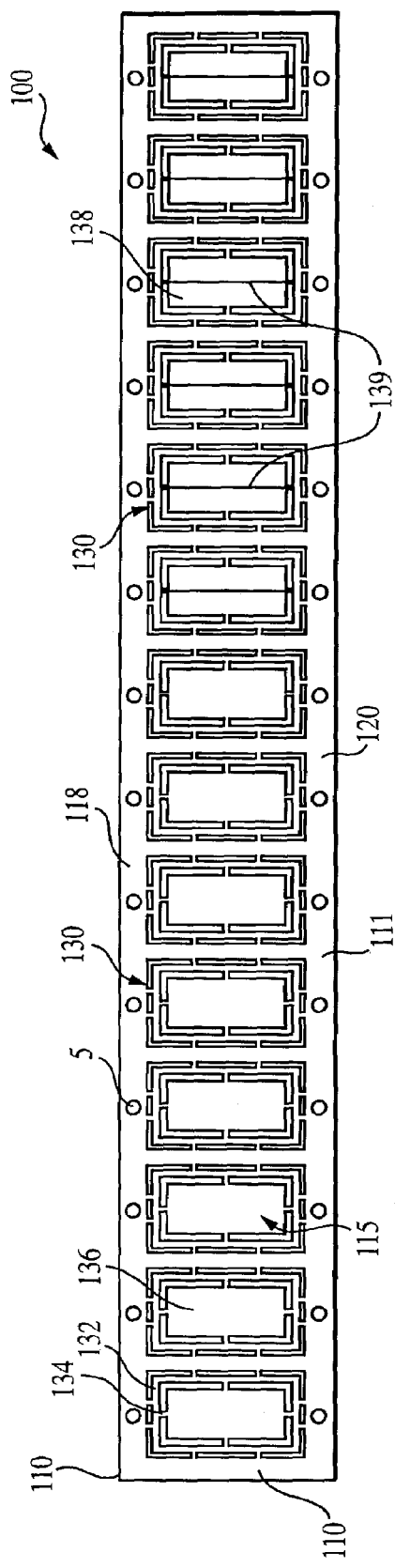
FIG. 8 top view of a composite strip constructed in accordance with an embodiment of the invention.
Figure 9:
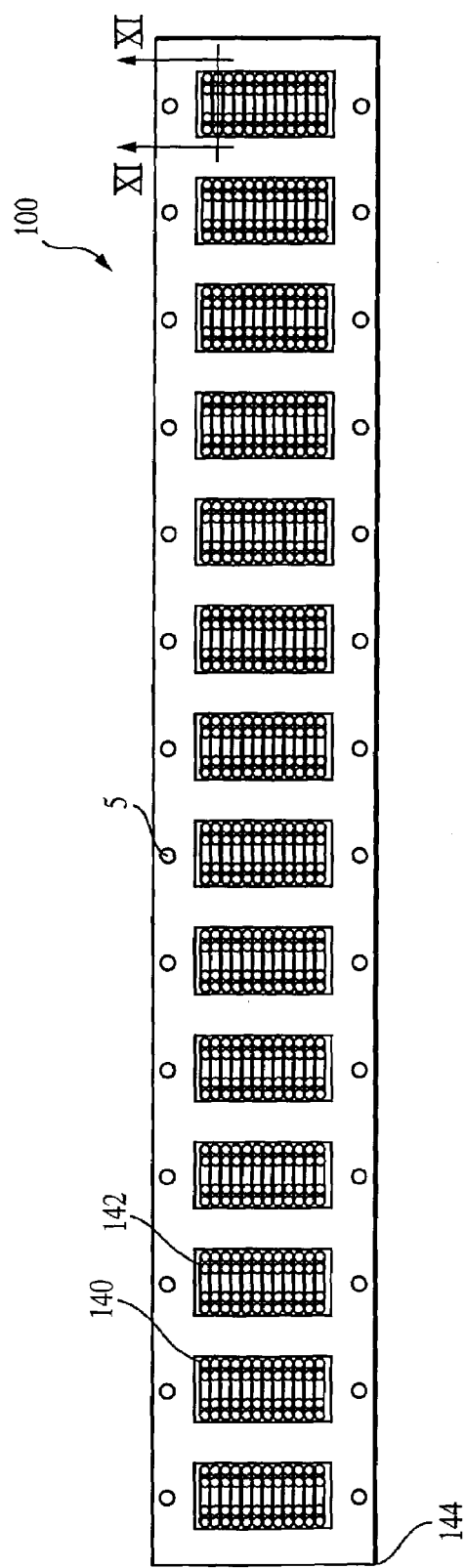
FIG. 9 is a top view of the composite strip of FIG. 8 including a tape.
Figure 10:
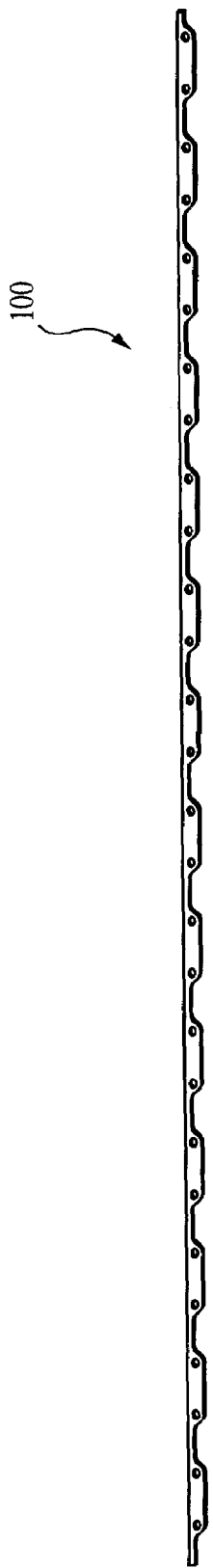
FIG. 10 is a side view of the composite strip of FIG. 8.
Figure 11:
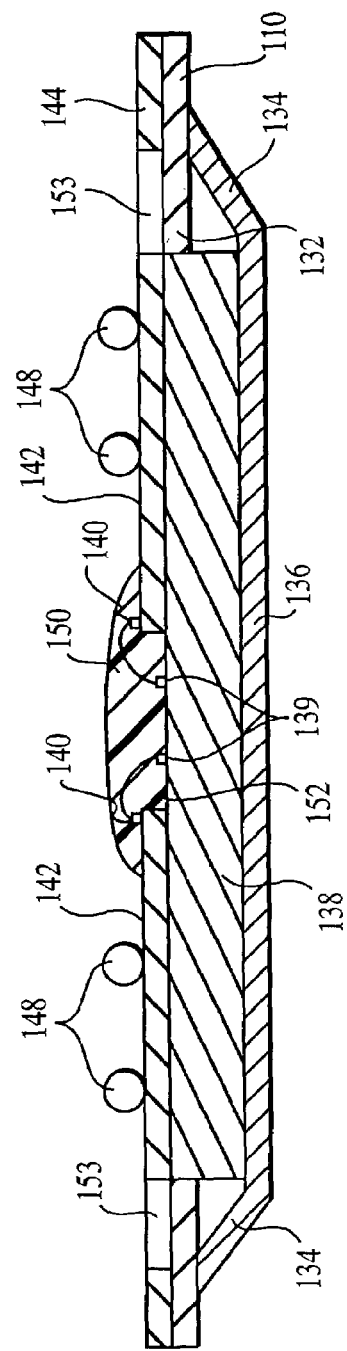
FIG. 11 is a close-up cross-sectional view taken along line XI—XI of FIG.9.

A plurality of die mounting areas 115 is shown on the lead frame support structure 110, each die mounting area 115 being spaced apart from each other die mounting area 115. Semiconductor packages 130 may be located at each respective die mounting area 115. Each die mounting area 115 is defined by a frame 132. The frame 132 includes descending portions, such as, for example, tie bars 134, which lead to and connect with a downset die paddle 136. Instead of tie bars 134, the descending portions may be formed by punching out the downset die paddles 136 from the lead frame support structure 110. Each semiconductor die 138 is mounted on a respective die paddle 136 within the die mounting area 115. As shown in FIG. 8, the dies 138 are attached to the die paddles 136 such that the active surface of the dies 138 containing circuitry 139, including solder contact pads, faces away from the die paddles 136. Preferably, the distance of the die paddle 136 from a top surface 111 of the lead frame support structure 110 should be such that the surface of the die 138 facing away from the die paddles 136 is in the same plane as the top surface 111 of the support structure 110. The dies 138 may be attached to the downset die paddle 136 with an adhesive material (not shown).

Figure 12:
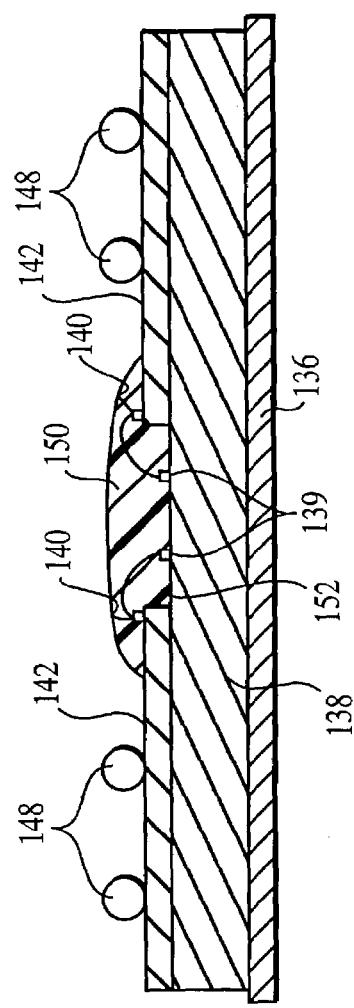
FIG. 12 is a cross-sectional view of a singulated semiconductor package from the composite strip of FIG. 8.

After attachment of the dies 138 to the downset die paddles 136, a tape 144 is placed on the lead frame support structure 110 such that it covers the frames 132 and adheres to the rails 118, 120 and a surface of the dies 138. The tape 144 may be laminated or otherwise adhered to the lead frame support structure 110. The tape 144 may be dispensed either in a strip format, in which the tape 144 is pre-cut to the necessary size for the lead frame support structure 110, or via reel-to-reel format, where the tape 144 is unrolled from a reel and then cut to size. Further, the tape 144 may be formed of a single ply material or a double ply material. Solder bump pads 140 and circuit traces 142 which are configured to electrically connect with contact pads 139 formed on the active surface of the dies 138 are included in the tape 144. The tape 144 further includes openings 152 (FIG. 11) to allow electrical connection, e.g. by wire bonding, tab bonding, or Tessera bonding, between the bump pads 140 of the tape 144 and the contact pads 139 of the semiconductor dies 138. Glob tops 150 may be deposited over the openings 152 to provide protection for the circuit traces 142, wire bonding and solder bump pads 140 and the contact pads 139 of the dies 138. Solder balls 148 are further included on a surface of the tape 144 which electrically connect with the circuit traces 142 for electrically connecting the dies 138 with a printed circuit board (not shown). The solder balls 148 are positioned over the dies 138 and within slots 152 formed in the tape 144. The slots 153 are so located to facilitate singulation of each die package (FIG. 12).

Figure 13:
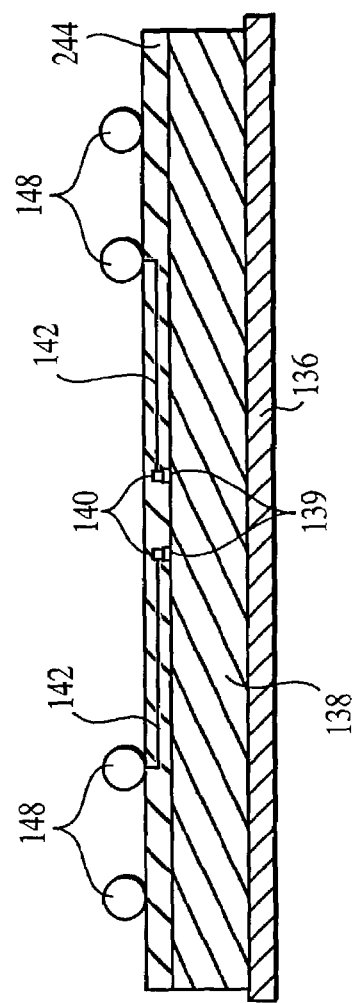
FIG. 13 is a close-up cross-sectional view of a singulated semiconductor package constructed in accordance with another embodiment of the invention.

Alternatively, and as illustrated in FIG. 13, a tape 244 may be attached to the top surface 111 of the lead frame support structure 110. The tape 244 has solder bump pads 140 extending downwardly in a direction toward the dies 138. The solder bump pads 140 may directly contact the contact pads 139 of the dies 138 as shown, or may be wire bonded thereto. Circuit traces 142 extend from the solder bump pads 140 through the tape 244 to locations in the tape 244 at which solder balls 148 are deposited. Again, the solder balls 148 are located at positions above the die 138.

Figure 14:
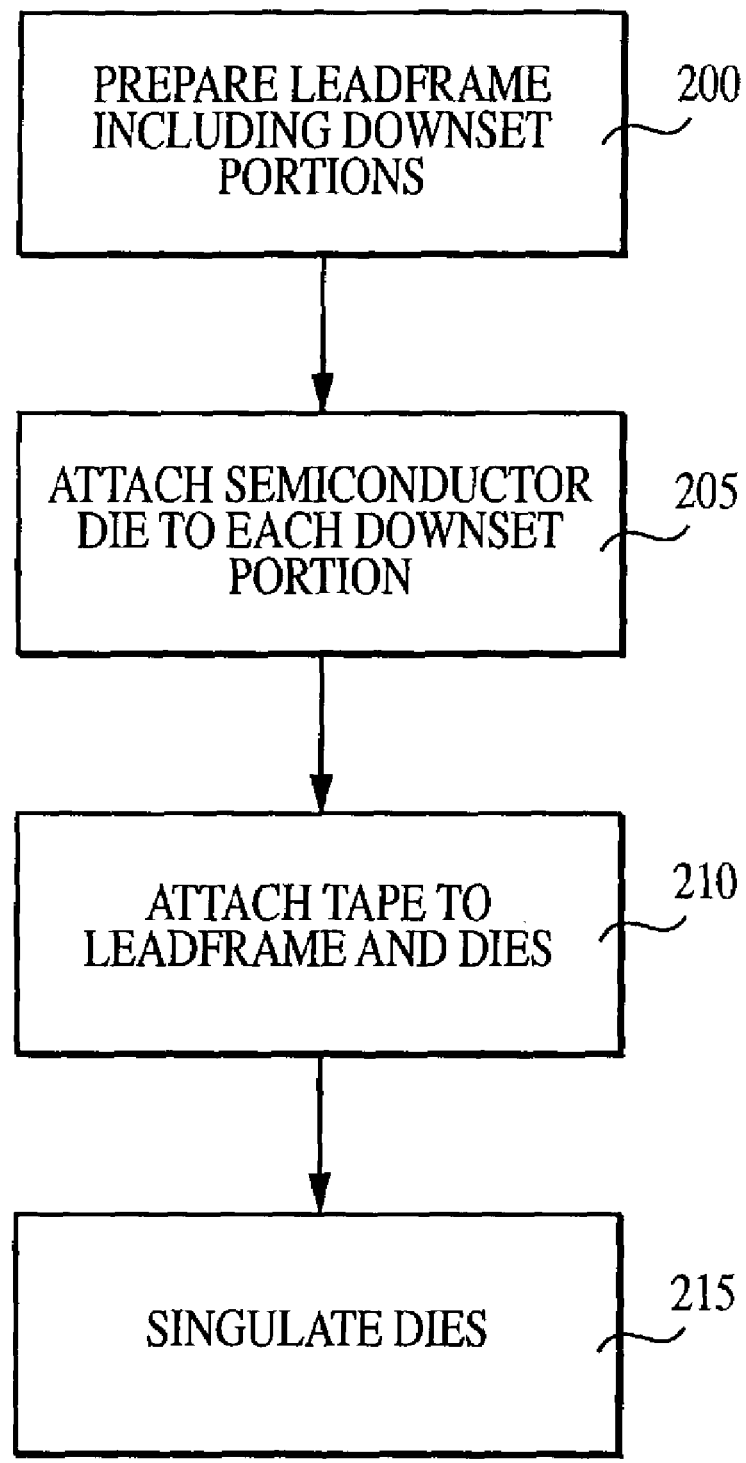
FIG. 14 illustrates steps for fabricating a semiconductor package in accordance with an embodiment of the invention.

Referring specifically to FIG. 14, next will be described a method for fabricating the semiconductor packages illustrated in FIGS. 8–12. Beginning at step 200, a leadframe 110 is prepared which includes a plurality of downset portions, such as the downset die paddles 136. Semiconductor dies, such as dies 138 are then attached to the downset portions 136 at step 205. An adhesive may be used to attach the dies 138 to the downset portions 136. Preferably, the downset portions 136 are formed with a thickness such that an attached die 138 would have a surface in the same plane as the top surface 111 of the leadframe 110. After attaching the dies 138 to the downset portions 136, a tape 144 is attached to the leadframe and dies at step 210. The tape 144 includes circuit traces 142 to which the contact pads 139 of the dies 138 are electrically connected, either through wirebonding, tab bonding, or Tessera bonding. Finally, after electrically connecting the circuitry 142 of the tape 144 to the contact pads 139 of the dies 138, the dies 138 are singulated at step 215.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed is:

1. A method for fabricating semiconductor packages, comprising:
   forming a frame with a plurality of downset portions in a substrate;
   attaching semiconductor dies to said downset portions, each said semiconductor die including upwardly facing contact pads;
   attaching a tape to said frame and said dies, said tape including circuit traces and solder balls;
   electrically connecting first terminals of at least some of said traces to respective ones of said solder balls; and
   electrically connecting second terminals of said at least some of said traces with contact pads on said semiconductor dies such that electrical connections are provided from said contact pads to said solder balls.

2. The method of claim 1, wherein said electrically connecting step comprises wire bonding.

3. The method of claim 1, wherein said electrically connecting step comprises tab bonding.

4. The method of claim 1, further comprising applying protective insulation over said tape to protect the electrical connection of said contact pads of said dies with said electrical traces of said tape.

5. The method of claim 1, further comprising singulating said dies and associated downset portions from said frame.

6. The method of claim 1, wherein said frame comprises index holes and said tape comprises index holes and wherein said attaching tape step includes lining up said frame index holes with said tape index holes.

7. The method of claim 1, wherein attaching said semiconductor dies to said downset portions precedes attaching said tape.

8. The method of claim 1, wherein said attaching said tape step comprises attaching a pre-cut strip of tape to said frame.

9. The method of claim 1, wherein said attaching said tape step comprises dispensing said tape from a reel and cutting said tape to size.

10. A method for fabricating a semiconductor package, comprising:
    forming a frame with a downset portion in a substrate;
    attaching a semiconductor die to said downset portion, said semiconductor die including upwardly facing contact pads;
    attaching a tape to said frame and said die, said tape including circuit traces and solder balls;
    electrically connecting first terminals of at least some of said traces to respective ones of said solder balls; and
    electrically connecting second terminals of said at least some of said circuit traces with said contact pads on said semiconductor die such that electrical connections are provided from said contact pads to said solder balls.

* * * * *

UNITED STATES PATENT AND TRADEMARK OFFICE
CERTIFICATE OF CORRECTION

| | | |
|---|---|---|
| PATENT NO. | : 7,226,813 B2 | Page 1 of 1 |
| APPLICATION NO. | : 10/358275 | |
| DATED | : June 5, 2007 | |
| INVENTOR(S) | : David J. Corisis | |

It is certified that error appears in the above-identified patent and that said Letters Patent is hereby corrected as shown below:

In the Specification, the following errors are corrected:

Column 1:

Line 49, "ate" should read --are--; and

Lines 63 & 65, "dice" should read --dies--.

Column 3:

Lines 17 & 22, "dice" should read --dies--; and

Line 17, "include" should read --includes--.

Column 4:

Line 21, "bonds" should read --bond--;

Line 33, "2 is mounted" should read --2 mounted--; and

Lines 34 & 37, "dice" should read --dies--.

Column 5:

Line 29, "dice" should read --dies--.

Signed and Sealed this

Fourteenth Day of August, 2007

JON W. DUDAS
*Director of the United States Patent and Trademark Office*